(12) United States Patent
Wheeler et al.

(10) Patent No.: US 7,130,784 B2
(45) Date of Patent: Oct. 31, 2006

(54) LOGIC SIMULATION

(75) Inventors: William R. Wheeler, Southborough, MA (US); Timothy J. Fennell, Holliston, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 747 days.

(21) Appl. No.: 09/942,116

(22) Filed: Aug. 29, 2001

(65) Prior Publication Data

US 2003/0046053 A1    Mar. 6, 2003

(51) Int. Cl.
*G06F 17/50* (2006.01)

(52) U.S. Cl. ............................. 703/15; 703/13; 703/14; 716/1; 716/18

(58) Field of Classification Search .................. 703/14, 703/15, 16; 716/11, 18; 700/12
See application file for complete search history.

(56) References Cited

U.S. PATENT DOCUMENTS

| | | | |
|---|---|---|---|
| 4,587,625 A * | 5/1986 | Marino et al. ................. | 703/14 |
| 4,703,435 A | 10/1987 | Darringer et al. | |
| 4,970,664 A | 11/1990 | Kaiser et al. | |
| 5,128,871 A | 7/1992 | Schmitz | |
| 5,212,650 A | 5/1993 | Hooper et al. | |
| 5,220,512 A | 6/1993 | Watkins et al. | |
| 5,258,919 A | 11/1993 | Yamanouchi et al. | |
| 5,267,175 A | 11/1993 | Hooper | |
| 5,278,769 A | 1/1994 | Bair et al. | |
| 5,287,289 A | 2/1994 | Kageyama et al. | |
| 5,297,053 A | 3/1994 | Pease et al. | |
| 5,301,318 A | 4/1994 | Mittal | |
| 5,384,710 A | 1/1995 | Lam et al. | |
| 5,475,605 A | 12/1995 | Lin | |
| 5,493,507 A | 2/1996 | Shinde et al. | |
| 5,506,788 A | 4/1996 | Cheng et al. | |
| 5,513,119 A | 4/1996 | Moore et al. | |
| 5,544,067 A | 8/1996 | Rostoker et al. | |
| 5,553,002 A | 9/1996 | Dangelo et al. | |
| 5,568,397 A | 10/1996 | Yamashita et al. | |
| 5,598,347 A | 1/1997 | Iwasaki | |
| 5,603,015 A | 2/1997 | Kurosawa et al. | |
| 5,604,894 A | 2/1997 | Pickens et al. | |
| 5,629,857 A | 5/1997 | Brennan | |
| 5,663,662 A | 9/1997 | Kurosawa | |
| 5,666,289 A | 9/1997 | Watkins | |
| 5,673,198 A | 9/1997 | Lawman et al. | |

(Continued)

FOREIGN PATENT DOCUMENTS

EP    0 404 482    12/1990

(Continued)

OTHER PUBLICATIONS

"Process-Level Modeling with VHDL", J. Armstrong, Proceeding Verilog HDL Conference, Mar. 1998, IEEE.*

(Continued)

*Primary Examiner*—Fred Ferris
(74) *Attorney, Agent, or Firm*—Fish & Richardson P.C.

(57) ABSTRACT

Logic simulation includes storing a first state to identify in a simulation of a logic design whether a node included in the logic design has a logic high value Logic simulation also includes storing a second state to identify in simulation of the logic design whether the node has a logic low value and storing a third state to identify in simulation of the logic design whether the node has an undefined state. The logic simulation determines an output of the node in simulation of the logic design based on the first state, the second state, and the third state.

13 Claims, 6 Drawing Sheets

U.S. PATENT DOCUMENTS

| | | | |
|---|---|---|---|
| 5,685,006 A | 11/1997 | Shiraishi | |
| 5,694,579 A | 12/1997 | Razdan et al. | |
| 5,706,476 A * | 1/1998 | Giramma | 703/15 |
| 5,717,928 A | 2/1998 | Campmas et al. | |
| 5,724,250 A | 3/1998 | Kerzman et al. | |
| 5,734,581 A * | 3/1998 | Butts et al. | 703/15 |
| 5,757,655 A | 5/1998 | Shih et al. | |
| 5,796,623 A * | 8/1998 | Butts et al. | 703/23 |
| 5,809,283 A | 9/1998 | Vaidyanathan et al. | |
| 5,812,414 A * | 9/1998 | Butts et al. | 716/16 |
| 5,819,072 A * | 10/1998 | Bushard et al. | 716/18 |
| 5,828,581 A | 10/1998 | Matumura | |
| 5,831,869 A | 11/1998 | Ellis et al. | |
| 5,841,663 A | 11/1998 | Sharma et al. | |
| 5,852,564 A | 12/1998 | King et al. | |
| 5,889,677 A | 3/1999 | Yasuda et al. | |
| 5,892,678 A | 4/1999 | Tokunoh et al. | |
| 5,892,682 A | 4/1999 | Hasley et al. | |
| 5,903,469 A | 5/1999 | Ho | |
| 5,933,356 A | 8/1999 | Rostoker et al. | |
| 5,937,190 A | 8/1999 | Gregory et al. | |
| 5,963,724 A | 10/1999 | Mantooth et al. | |
| 5,974,242 A | 10/1999 | Damarla et al. | |
| 6,002,861 A * | 12/1999 | Butts et al. | 703/16 |
| 6,044,211 A * | 3/2000 | Jain | 716/18 |
| 6,053,947 A | 4/2000 | Parson | |
| 6,066,179 A | 5/2000 | Allan | |
| 6,077,304 A | 6/2000 | Kasuya | |
| 6,106,568 A | 8/2000 | Beausang et al. | |
| 6,117,183 A | 9/2000 | Teranishi et al. | |
| 6,120,549 A | 9/2000 | Goslin et al. | |
| 6,132,109 A | 10/2000 | Gregory et al. | |
| 6,135,647 A | 10/2000 | Balakrishnan et al. | |
| 6,152,612 A | 11/2000 | Liao et al. | |
| 6,161,211 A | 12/2000 | Southgate | |
| 6,178,541 B1 | 1/2001 | Joly et al. | |
| 6,205,573 B1 | 3/2001 | Hasegawa | |
| 6,208,954 B1 | 3/2001 | Houtchens | |
| 6,216,256 B1 | 4/2001 | Inoue et al. | |
| 6,219,822 B1 | 4/2001 | Griestede et al. | |
| 6,226,780 B1 | 5/2001 | Bahra et al. | |
| 6,233,540 B1 | 5/2001 | Schaumont et al. | |
| 6,233,723 B1 | 5/2001 | Pribetich | |
| 6,234,658 B1 | 5/2001 | Houldsworth | |
| 6,236,956 B1 | 5/2001 | Mantooth et al. | |
| 6,260,179 B1 | 7/2001 | Ohsawa et al. | |
| 6,272,671 B1 | 8/2001 | Fakhry | |
| 6,275,973 B1 | 8/2001 | Wein | |
| 6,292,931 B1 | 9/2001 | Dupenloup | |
| 6,298,468 B1 | 10/2001 | Zhen | |
| 6,311,309 B1 | 10/2001 | Southgate | |
| 6,324,678 B1 | 11/2001 | Dangelo et al. | |
| 6,327,693 B1 | 12/2001 | Cheng et al. | |
| 6,353,806 B1 | 3/2002 | Gehlot | |
| 6,353,915 B1 | 3/2002 | Deal et al. | |
| 6,360,356 B1 | 3/2002 | Eng | |
| 6,366,874 B1 | 4/2002 | Lee et al. | |
| 6,378,115 B1 | 4/2002 | Sakurai | |
| 6,381,563 B1 | 4/2002 | O'Riordan et al. | |
| 6,381,565 B1 | 4/2002 | Nakamura | |
| 6,401,230 B1 | 6/2002 | Ahanessians et al. | |
| 6,421,816 B1 | 7/2002 | Ishikura | |
| 6,438,729 B1 | 8/2002 | Ho | |
| 6,438,731 B1 | 8/2002 | Segal | |
| 6,440,780 B1 | 8/2002 | Kimura et al. | |
| 6,449,762 B1 | 9/2002 | McElvain | |
| 6,457,164 B1 | 9/2002 | Hwang et al. | |
| 6,466,898 B1 * | 10/2002 | Chan | 703/17 |
| 6,473,885 B1 | 10/2002 | Wallace | |
| 6,477,683 B1 | 11/2002 | Killian et al. | |
| 6,477,688 B1 | 11/2002 | Wallace | |
| 6,477,689 B1 | 11/2002 | Mandell et al. | |
| 6,480,985 B1 | 11/2002 | Reynolds et al. | |
| 6,484,295 B1 * | 11/2002 | McBride et al. | 716/4 |
| 6,487,698 B1 | 11/2002 | Andreev et al. | |
| 6,490,545 B1 | 12/2002 | Peng | |
| 6,505,328 B1 | 1/2003 | Van Ginneken et al. | |
| 6,505,341 B1 | 1/2003 | Harris et al. | |
| 6,516,456 B1 | 2/2003 | Garnett et al. | |
| 6,519,742 B1 | 2/2003 | Falk | |
| 6,519,755 B1 | 2/2003 | Anderson | |
| 6,523,156 B1 | 2/2003 | Cirit | |
| 6,539,536 B1 | 3/2003 | Singh et al. | |
| RE38,059 E | 4/2003 | Yano et al. | |
| 6,546,528 B1 | 4/2003 | Sasaki et al. | |
| 6,574,787 B1 | 6/2003 | Anderson | |
| 6,591,407 B1 | 7/2003 | Kaufman et al. | |
| 6,594,803 B1 * | 7/2003 | Weber et al. | 716/5 |
| 6,604,065 B1 * | 8/2003 | Blomgren et al. | 703/15 |
| 6,643,836 B1 * | 11/2003 | Wheeler et al. | 716/11 |
| 6,718,522 B1 * | 4/2004 | McBride et al. | 716/4 |
| 6,856,950 B1 * | 2/2005 | Abts et al. | 703/13 |
| 7,031,897 B1 * | 4/2006 | Blomgren et al. | 703/14 |
| 2001/0018758 A1 | 8/2001 | Tanaka et al. | |
| 2002/0023256 A1 | 2/2002 | Seawright | |
| 2002/0038447 A1 | 3/2002 | Kim et al. | |
| 2002/0042904 A1 | 4/2002 | Ito et al. | |
| 2002/0046386 A1 | 4/2002 | Skoll et al. | |
| 2002/0049957 A1 | 4/2002 | Hosono et al. | |
| 2002/0059054 A1 | 5/2002 | Bade et al. | |
| 2002/0112221 A1 | 8/2002 | Ferreri et al. | |
| 2002/0138244 A1 | 9/2002 | Meyer | |
| 2002/0166100 A1 | 11/2002 | Meding | |
| 2003/0004699 A1 | 1/2003 | Choi et al. | |
| 2003/0005396 A1 | 1/2003 | Chen et al. | |
| 2003/0016206 A1 | 1/2003 | Taitel | |
| 2003/0016246 A1 | 1/2003 | Singh | |
| 2003/0036871 A1 | 2/2003 | Fuller et al. | |
| 2003/0046052 A1 * | 3/2003 | Wheeler et al. | 703/15 |
| 2003/0046648 A1 * | 3/2003 | Wheeler et al. | 716/11 |
| 2003/0177455 A1 | 9/2003 | Kaufman et al. | |

FOREIGN PATENT DOCUMENTS

| | | |
|---|---|---|
| EP | 0 433 066 | 6/1991 |
| EP | 0 720 233 | 7/1996 |
| EP | 0 901 088 | 3/1999 |
| EP | 1 065 611 | 1/2001 |
| JP | 58-060559 | 4/1983 |
| JP | 03-225523 | 10/1991 |
| JP | 07-049890 | 2/1995 |
| JP | 08-314892 | 11/1996 |
| JP | 2001-068994 | 3/2001 |
| WO | WO 98/37475 | 8/1998 |
| WO | WO 98/55879 | 12/1998 |
| WO | WO 99/39268 | 8/1999 |
| WO | WO 00/65492 | 11/2000 |

OTHER PUBLICATIONS

"IEEE Standard Multivalue Logic System for VHDL Model Onteroperability", IEEE Standards Board, Mar. 1993.*

Foley et al., "An Object Based Graphical User Interface for Power Systems", IEEE Transactions on Power Systems, vol. 8, No. 1, Feb. 1993, pp. 97-104.

Pedram et al., "Floorplanning with Pin assignment", 1990 IEEE. International Conference on Computer-Aided Design, Nov. 11, 1990, pp. 98-101.

Renoir, HDL Design Datasheet, Mentor Graphics, 1-8, 1999.

Mentor Graphics Corporation, Renoir™ With HDL2Graphics™, pp. 1-6, 1998, Oregon.

Mentor Graphics Corporation, Renoir HDL Design Datasheet, pp. 1-2, 1999, Oregon.

Computer Design, "After Hard Knocks, Cycle-Based Simulators Stand Their Ground". http://www.computer-design.com/Editorial/1996/10/ASIC/after.html, accessed on Aug. 23, 2001, pp. 1-5.

Parlakbilek, et al., "A Multiple-Strength Multiple-Delay Compiled-Code Logic Simulator", *IEEE Transactions on Computer-Aided Design of Integrated Circuits and Systems,* 12(12):1937-1946 (1993).

Gassenfeit, E. H., "Control System Design Realization via VHDL-A: Requirements", Proceedings of the 1996 IEEE International Symposium on Computer-Aided Control System Design, Sep. 15, 1996, pp. 282-285.

Kutzschebauch, "Efficient logic optimization using regularity extraction", Proceedings of 2000 International Conference on Computer Design, Sep. 17, 2000, pp. 487-493.

Lahti, et al., "SADE: a Graphical Toll for VHDL-Based System Analysis", 1991 IEEE International Conference on Computer-Aided Design, Nov. 11, 1991, pp. 262-265.

Lin, et al., "A Goal Tree Based High-Level Test Planning System for DSP Real Number Models", 1998 Proceedings of International Test Conference, Oct. 18, 1998, pp. 1000-1009.

Maxfield, C., "Digital Logic Simulation: Event-Driven, Cycle-Based, and Home-Brewed", *Electrical Design News,* 41(14):129-136 (1996).

NB84035598, "Binary Relational Schema to Model Structured LSI Design", IBM Technical Disclosure Bulletin, vol. 26, No. 10B, Mar. 1984, pp. 5598-5601.

NN7807629, "Functional Oriented Symbolic Macromodeling Algorithm", IBM Technical Disclosure Bulletin, vol. 21, No. 2, Jul. 1978, pp. 629-631.

NN8006341, "Macro Physical-To-Logical Checking LSI Chip Design", IBM Technical Disclosure Bulletin, vol. 23, No. 1, Jun. 1980, pp. 341-345.

NN9407481, "Functional Modeling using object Collaboration Diagram", IBM Technical Disclosure Bulletin, vol. 37, No. 7, Jul. 1994, pp. 481-486.

Su, Stephen, "An Interactive Design Automation System", *Proceedings of the 10th Design Automation Workshop on Design Automation,* pp. 253-261, Jun. 1973.

Yli-Pietila, et al., "The Design and Simulation of Complex Multitechnology Systems", IEEE International Conference on Systems Engineering, Aug. 9, 1990, pp. 474-477.

* cited by examiner

LOGIC SIMULATION

BACKGROUND

This invention relates to logic simulation.

Logic designs for computer chips typically include combinatorial elements and state elements. Combinatorial elements, such as AND gates and OR gates, combine two or more logic states to produce an output. State elements, such as latches and flip-flops (FFs), hold a logic state for a period of time, usually until receipt of an external clock signal.

SUMMARY

Logic simulation includes storing a first state to identify in a simulation of a logic design whether a node included in the logic design has a logic high value Logic simulation also includes storing a second state to identify in simulation of the logic design whether the node has a logic low value and storing a third state to identify in simulation of the logic design whether the node has an undefined state. The logic simulation determines an output of the node in simulation of the logic design based on the first state, the second state, and the third state.

Computer languages exist which allow designers to simulate logic designs, including combinatorial and state elements, prior to forming the logic on silicon. Examples of such languages include Verilog and Very High-Level Design Language (VHDL). Using these languages, a designer can write code to simulate a logic design and execute the code in order to determine if the logic design performs properly.

In simulating the logic design, the code can perform two state simulation and/or four state simulation. In two state simulation, the code models two logic states: one and zero. In four state simulation, the code models the one and zero logic states handled during two state simulation, an undefined state, and a high impedance state. Two state simulation can quickly execute and detect errors in high and low logic states in the logic design while four state simulation can detect design problems when signals in the logic design are not initialized (e.g., are undefined) or driven by other logic (e.g., have high impedance).

Standard computer languages may also be used to simulate a logic design. One example of a standard computer language that may be used is C++.

DESCRIPTION

Figure 1:
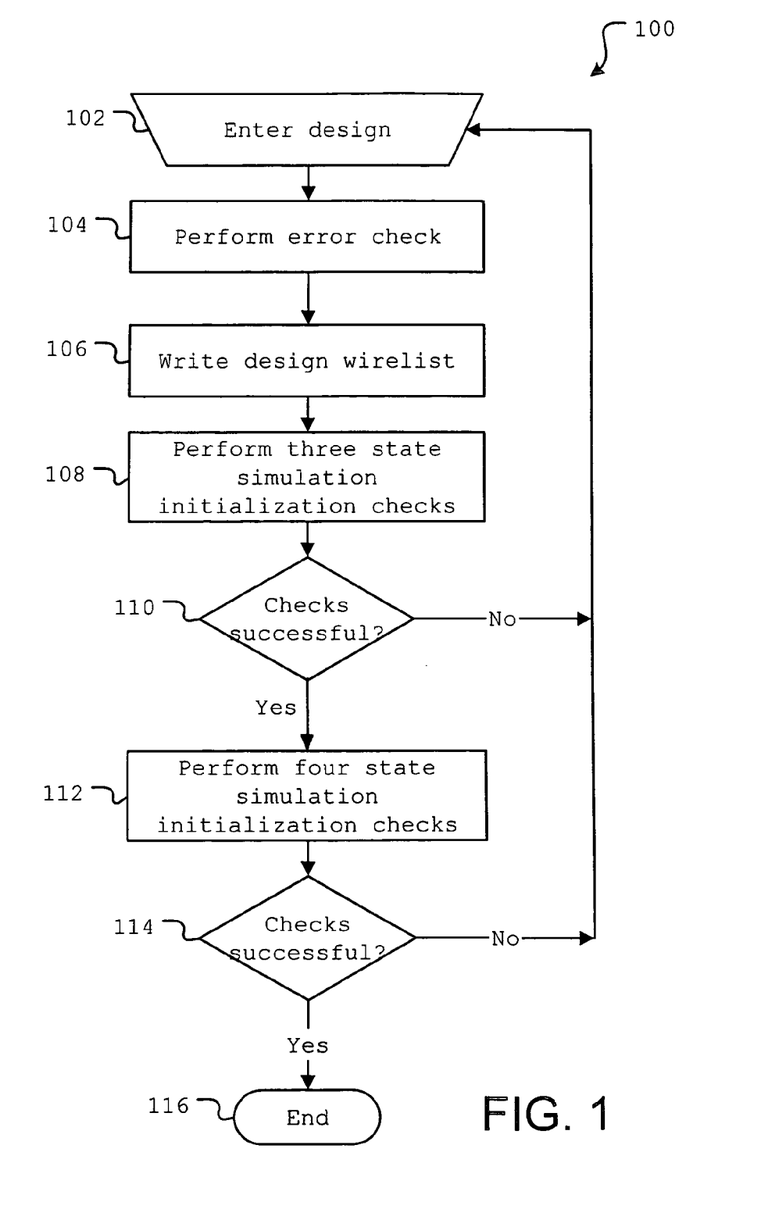
FIG. 1 is a flowchart showing a process of simulating operation of a logic design.

Referring to FIG. 1, a process 100 illustrates an example of simulating operation of a hardware circuit or logic design represented by a block diagram using three state simulation. The process 100 may be implemented using a computer program running on a computer or other type of machine as described in more detail below.

By using three state simulation, the process 100 can model a state at a node in the block diagram as a logic high (e.g., a one), as a logic low (e.g., a zero), or as an undefined value. (A logic high may be a zero if a logic low is a one.) In this way, the process 100 can perform simulation as in a traditional two state simulation with logic high and low states while detecting undefined states (improperly reset or improperly initialized designs) quickly, accurately, and early in the logic design and simulation process. Upon detection of an undefined state, the logic designer can change the logic design so as to get the state properly initialized, and so forth.

Figure 2:
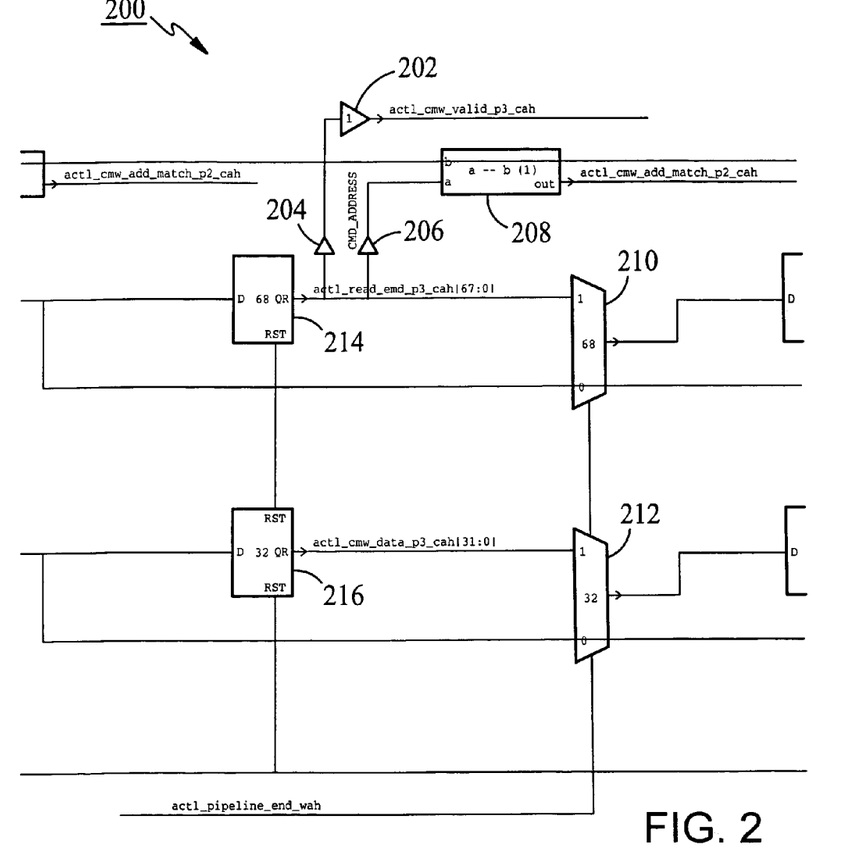
FIG. 2 is a block diagram of a logic design containing individual state and combinatorial elements.

Each block in the block diagram may represent individual elements or combinations of elements. For example, FIG. 2 shows a graphical representation of a logic design 200 containing combinatorial logic elements 202, 204, 206, and 208 and state logic elements 210 and 212. In the logic design 200, each block represents a single combinatorial element (e.g., multiplexors 206 and 208) or state elements (e.g., FFs 210 and 212). By contrast, in logic design 300 (FIG. 3), the functionality of several combinatorial elements is contained in a single combinatorial block 302 and the function of several state elements is contained in a single state block 304.

Once the graphical representation of the logic design has been completed 102 (e.g., FIGS. 2 and 3), the process 100 performs 104 an error check on the design to determine if there are any problems with the design. For example, the process 100 may determine if there are any unterminated or inconsistent connections in the design. If any such problems are detected, the process 100 can issue an error message to a logic designer. The error message may specify the nature of the problem and its location within the logic design. The logic designer is then given the opportunity to correct the problem before the process 100 moves forward.

The process 100 writes 106 a design wirelist in computer code that simulates the logic design with each of the graphic elements.

Figure 3:
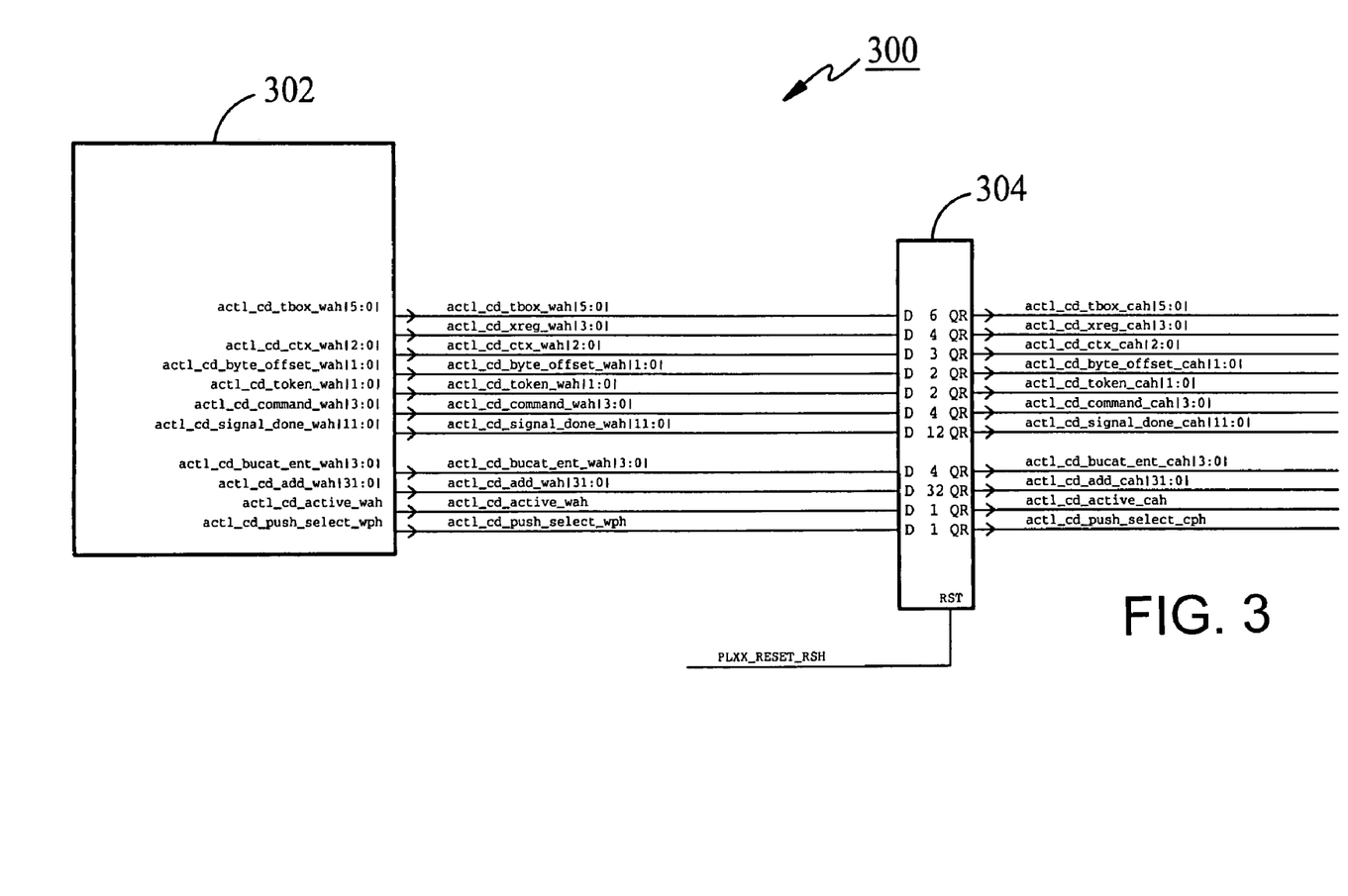
FIG. 3 is a block diagram of an alternative logic design containing state and combinatorial elements.

Referring to FIG. 3, for example, the process 100 associates computer code with the combinatorial logic element 302 to define its function and with state logic element 304 to define its function. Furthermore, the process 100 knows which nodes are subject to three state simulation processing (those nodes between logic elements) and tags those nodes as tri-state nodes in the computer code. The same associating and tagging is true for the logic elements of FIG. 2. The computer code can be generated using any generation process.

For example, the process 100 may include receiving intermediate computer code (e.g., an application-specific code such as C++ or Verilog) for each graphic element written by the logic designer. Assuming that there are no problems in the design or that the problems have been corrected, the process 100 may generate standard simulation code for the design in any kind of computer code, such as C++, Verilog, VHDL, and other similar codes.

Once the process 100 has computer code that simulates the logic design, the process 100 performs 108 three state simulation initialization checks for the logic elements included in the logic design. In executing the code in the simulation, the process 100 checks each tri-state signal (those signals on wires that connect tri-state drivers as tagged in the code) to make sure that two (or more) drivers are not driving at the same time on any bit of a tri-state signal. The process 100 checks every bit position of the tri-state signal, e.g., each wire driving a logic device, to make sure that at least one tri-state driver is enabled, e.g., that a signal exists on the wire. Any bit of the signal that is not driven by one driver is flagged as not being driven or as multiply driven.

Figure 4:
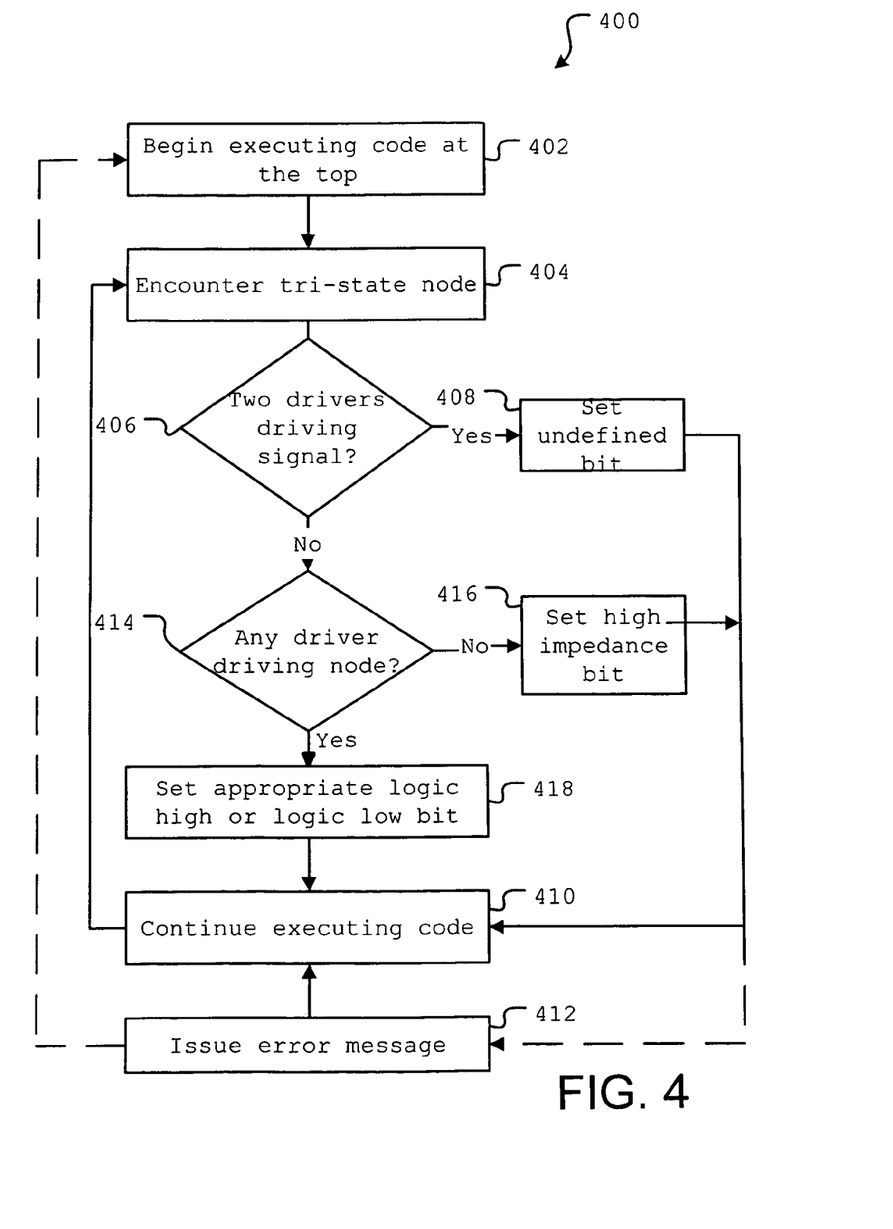
FIG. 4 is a flowchart showing a process of performing three state simulation initialization checks.

Referring to FIG. 4, a tri-state process 400 illustrates an example of how the process 100 may perform such three state simulation initialization checks. The tri-state process 400 begins 402 by executing the computer code starting at the beginning of the code. In other words, the simulation is performed in a cycle-based, code-ordered fashion as a single call model, running through the code once and establishing all states in the coded logic design.

The tri-state process 400 may store state information in a database. If the code is in a language with inheritance capabilities such as C++, the tri-state process 400 can enable the code compiler to handle the large number of states that may result from a given logic model. That is, the state of an initial logic gate may be defined as a class (e.g., a C++ class). The states of the logic gates that depend from the initial logic gate may refer back to the state of the initial logic gate without actually including data for the state of the initial logic gate. This way, if the state of a subsequent gate depends on the state of a preceding gate, it is possible to obtain the state of the preceding gate without actually adding more data to the database.

When the tri-state process 400 encounters 404 a tri-state signal in the code, the tri-state process 400 determines 406 if two (or more) drivers are driving any bit of the signal. If so, then a potential contention exists on the wire line, so the output of the tri-state signal has an undefined state. The tri-state process 400 sets 408 the undefined bit for that signal, indicating an undefined state for that signal. The tri-state process 400 continues 410 executing the code. Alternatively, the tri-state process 400 may terminate or suspend the simulation upon detection of the undefined state and issue 412 an error message to the logic designer as described above. The logic designer fixes the problem and the tri-state process 400 can resume simulation of the logic design at the point of termination or at the beginning of the code.

If two (or more) drivers do not drive the signal, then the tri-state process 400 determines 414 if any source drives the signal. If not, then the tri-state process 400 can deduce on the fly that the signal has a high impedance state. The tri-state process 400 may not hold information in a bit on the high impedance state, but, if it does, it sets 416 a high-impedance bit for that signal. Whether the tri-state process 400 sets a high impedance bit or not, the tri-state process 400 may continue 410 executing the code or may issue 412 an error message as described above.

If less than two drivers but more than zero drivers drive the signal, then one driver drives the signal. The tri-state process 400 sets 418 the appropriate one of the logic high and logic low states for the signal, logic high for a signal state of one and logic low for a signal state of zero. The tri-state process 400 continues 410 executing the code as described above.

Referring again to FIG. 1, after performing the three state simulation initialization checks, the process 100 determines 110 if the checks were successful. The checks are successful if the process 100 does not detect any undefined states. If the checks were unsuccessful, then the process 100 ends until another design is entered 102, e.g., until the logic designer modifies the logic design to try to fix the detected state initialization error or errors. (If the process 100 terminates the checks upon detecting an undefined state and/or a high impedance state, then the process 100 knows that the checks were not successful and ends until another design is entered.)

If the checks were successful, then the process 100 may perform 112 another check or checks, such as four state simulation. Four state simulation typically involves simulating the logic design using four bits to represent four logic states: logic high, logic low, undefined, and high impedance. Performing four state simulation can help refine the initialization model deemed successful under the previously performed three state simulation. The process 100 need not perform the four state simulation or any other checks after three state simulation.

The process 100 can also determine 114 if the four state simulation was successful. In other words, the process 100 determines if any states are tagged as undefined and/or as high impedance. This check can be performed, for example, after the four state simulation. If the checks were unsuccessful, then the process 100 ends until another design is entered as described above. If the checks were successful, then the process ends 116, indicating that the logic design is properly initialized.

In executing the code during simulation, the process 100 performs logic computations, e.g., AND operations for AND gates, and attempts to store results of the logic computations in memory. Memory is typically divided into pages (sometimes called virtual memory pages), each page including a defined amount of data (usually expressed in bytes) corresponding to code. If a page is write-protected, then the process 100 cannot write the result to memory, resulting in an error.

The process 100 may use the fact that pages can be write-protected to handle forced results. A result is forced if the logic designer, typically for purposes of simulation, defines the result to be a particular value regardless of the actual result of a logic computation.

While executing the code, the process 100 could check each node to determine if the node has a forced value. This determination, however, can slow down the simulation and use valuable processing resources. Instead, the process 100 may identify forced nodes while writing the design wirelist and set access rights for the page or pages including those forced nodes as write-protected. Then, when the process 100 executes the code, forced nodes may be identified by an attempt to write to a write-protected memory page rather than by a slower node-by-node evaluation of forced values.

Figure 5:
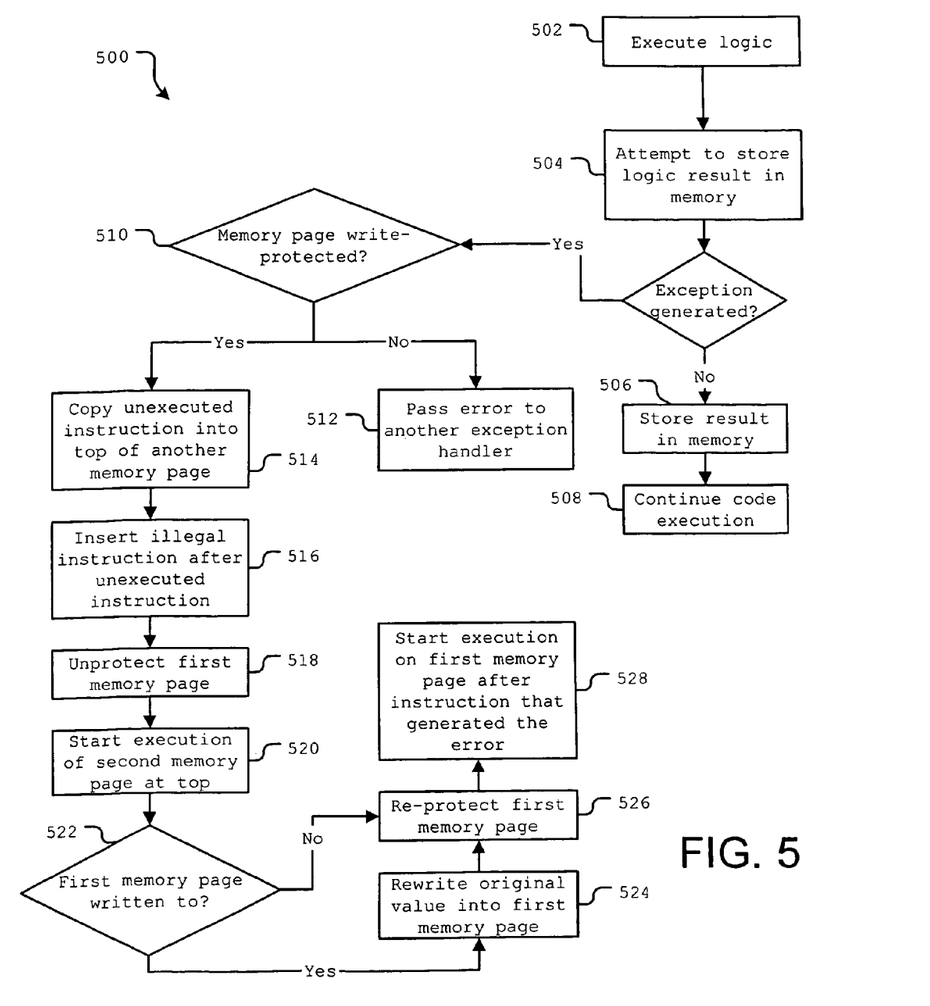
FIG. 5 is a flowchart showing a process of handling forced nodes in cycle-based simulation.

Referring to FIG. 5, a force process 500 illustrates an example of how the process 100 may handle storage of logic results and forced nodes during cycle-based simulation. In generating the code for simulation, the memory page or pages associated with any forced nodes included in the logic design are write-protected. In this way, the force process 500 can identify which nodes are forced by encountering storage errors as further described below. The force process 500 may be used in any cycle-based simulation.

The force process 500 may perform 502 a logic computation and attempt 504 to store the result of the logic computation in memory. If storage cannot occur for some reason, the force process 500 generates an exception indicating an error condition. If the force process 500 does not generate an exception in attempting to store the result in the memory page, then the force process 500 stores 506 the result in memory and continues 508 executing the code.

If the force process 500 does generate an exception, then the force process 500 calls or executes an exception handler to interrogate the system to determine the reason for the exception. A plurality of exception handlers may be available to the force process 500, each exception handler capable of handling a particular type of exception, e.g., write access errors, invalid memory address, etc. Typically, exception handlers are accessed in a predetermined order, where the exception is passed from one exception handler to the next until the exception reaches the exception handler capable of handling that particular type of exception. In this example, the force process 500 first passes the exception to a first exception handler capable of handling write access errors.

The first exception handler determines 510 if the exception was generated because of a write access problem. If not, then the first exception handler passes 512 the exception to the next exception handler according to the predetermined order. This exception handler either handles the exception or passes the exception to the next exception handler, and so on until the exception reaches the appropriate exception handler and is handled.

If the error was generated because of a write access problem, then the first exception handler handles the exception. The first exception handler knows which instruction in the code caused the exception because the instruction that caused the force process 500 to generate the exception is usually included in the exception. The first exception handler stores 514 this instruction, as yet unexecuted, at the top of a non-write protected memory page. This memory page is typically a memory page that does not include any of the code being executed by the process 100 and may be a page set aside for use by the first exception handler. Immediately following this instruction in the memory page, the first exception handler inserts 516 an illegal instruction that will always generate an exception when executed. The first exception handler also unprotects 518 the original write-protected memory page where the force process 500 tried to store the result.

The force process 500 then redirects code execution to start execution 520 at the top of the memory page used by the first exception handler. The originally failed instruction executes and because the original memory page is no longer write-protected, the force process 500 can write the result to the original memory page. In this way, the force process 500 can execute the instruction as if the artificially forced value was not present and therefore simulate operation of the logic design as it would actually be executed in hardware to increase the chances of finding initialization errors during this simulation.

The memory page continues executing with the illegal instruction, which generates an exception. This exception passes to an exception handler that determines 522 if the force process 500 wrote to the original memory page.

If the force process 500 did store the result in the original memory page, then the force process 500 concludes that the value at that node is forced because the page was write-protected, indicating that at least one value stored in that page is forced, and because the result changed from that stored value. Thus, the force process 500 rewrites 524 the original value (the presumably forced value) back into the original memory page.

The force process 500 also re-protects 526 the original memory page so as to catch any later attempts to overwrite a forced value stored in the original memory page.

After re-protecting the original memory page, the force process 500 starts 528 executing code at the original memory page at the instruction following the instruction that generated the original exception.

If the force process 500 did not store the result in the original memory page, then the force process 500 concludes that the value at that node is not forced. In other words, an exception was properly generated because the force process 500 attempted to write the result into a write-protected memory page, but the page was write-protected for a reason other than because the result at that node is forced, e.g., another node value mapped to that page is forced. The force process 500 thus leaves the page as is, re-protects 526 the original memory page, and starts 528 executing code at the original memory page at the instruction following the instruction that generated the original exception.

Thus, in this scenario where the exception was properly generated but the value was determined to not be forced, the force process 500 performed some ultimately unnecessary operations, particularly those involving the additional memory page. However, as memory pages are usually quite small (on the order a few kilobytes) and as not many nodes are forced in logic designs (if any are at all), the computation in the force process 500 is typically much less than the computation involved in checking every node for a forced value.

Figure 6:
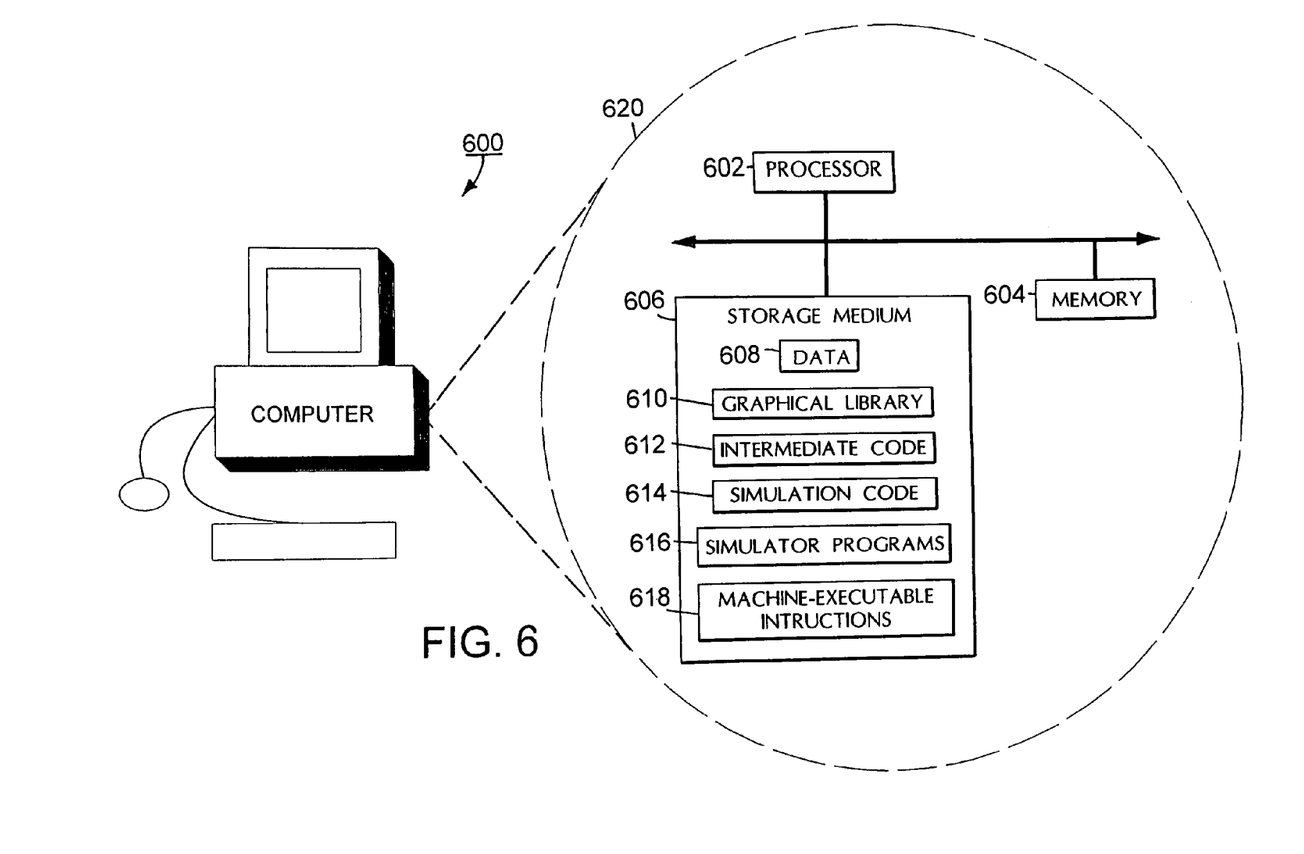
FIG. 6 is a block diagram of a computer system on which the processes of FIGS. 1, 4, and/or 5 may be performed.

FIG. 6 shows a computer 600 for performing simulations using the process 100, the tri-state process 400, and the force process 500. Computer 602 includes a processor 604, a memory 606, and a storage medium 608 (e.g., a hard disk). Storage medium 608 stores data 610 which defines a logic design, a graphics library 612 for implementing the logic design, intermediate code 614 and simulation code 616 that represents the logic design, logic simulator programs 618 (e.g., event-driven and/or cycle-based), and machine-executable instructions 620, which are executed by processor 604 out of memory 606 to perform the process 100, the tri-state process 400, and the force process 500 on data 610.

The process 100, the tri-state process 400, and the force process 500, however, are not limited to use with the hardware and software of FIG. 6; they each may find applicability in any computing or processing environment. The process 100, the tri-state process 400, and/or the force process 500 may be implemented in hardware, software, or a combination of the two. The process 100, the tri-state process 400, and/or the force process 500 may be implemented in computer programs executing on programmable computers or other machines that each includes a processor, a storage medium readable by the processor (including volatile and non-volatile memory and/or storage elements), at least one input device, and one or more output devices. Program code may be applied to data entered using an input device, such as a mouse or a keyboard, to perform the process 100, the tri-state process 400, and/or the force process 500 and to generate a simulation.

Each such program may be implemented in a high level procedural or object-oriented programming language to communicate with a computer system. However, the programs can be implemented in assembly or machine language. The language may be a compiled or an interpreted language.

Each computer program may be stored on an article of manufacture, such as a storage medium or device (e.g., CD-ROM, hard disk, or magnetic diskette), that is readable by a general or special purpose programmable machine for configuring and operating the machine when the storage medium or device is read by the machine to perform the process 100. The process 100, the tri-state process 400, and the force process 500 may also be implemented as a machine-readable storage medium, configured with a computer program, where, upon execution, instructions in the computer program cause the machine to operate in accordance with the process 100, the tri-state process 400, and the force process 500.

The invention is not limited to the specific embodiments set forth above. For example, the process 100 is not limited to simulating only combinatorial and state logic elements. Other logic elements may be simulated. The process 100, the tri-state process 400, and the force process 500 are not limited to the computer languages set forth above, e.g., Verilog, C++, and VHDL. It may be implemented using any appropriate computer language. Elements of the processes presented may be executed in a different order than that shown to produce an acceptable result.

Other embodiments not described herein are also within the scope of the following claims.

What is claimed is:

1. A computer implemented method of simulating a logic design, the method comprising:
    storing a first state to identify in a simulation of a logic design whether a node included in the logic design has a logic high value;
    storing a second state to identify in simulation of the logic design whether the node has a logic low value;
    storing a third state to identify in simulation of the logic design whether the node has an undefined state; and
    performing a three state simulation of the logic design to determine an output of the node in simulation of the logic design based on the first state, the second state, and the third state; and
    determining if the three state simulation of the logic design was successful, based on whether the output of the node has an undefined state, the three state simulation being successful if the output of the node is a defined state; and
    performing a four state simulation of the logic design if the three state simulation of the logic design was successful.

2. The computer implemented method of claim 1 further comprising determining whether the output of the node in simulation of the logic design has a high impedance state based on the first state, the second state, and the third state.

3. The computer implemented method of claim 1 further comprising storing the third state only if at least two sources drive the node.

4. The computer implemented method of claim 1 further comprising:
    determining the output based on which of the first state, the second state, and the third state is at a logic high.

5. An article for simulating a logic design, the article comprising:
    a machine readable medium which contains machine executable instructions, the instructions causing a machine to:
        store a first state to identify in a simulation of a logic design whether a first node included in the logic design has a logic high value;
        store a second state to identify in simulation of the logic design whether the first node has a logic low value;
        store a third state to identify in simulation of the logic design whether the first node has an undefined state; and
        perform a three state simulation of the logic design to determine an output of the node in simulation of the logic design based on the first state, the second state, and the third state; and
        determine if the three state simulation of the logic design was successful, based on whether the output of the node has an undefined state, the three state simulation being successful if the output of the node is a defined state; and
        perform a four state simulation of the logic design if the three state simulation of the logic design was successful.

6. The article of claim 5 further causing a machine to determine whether the output of the node in simulation of the logic design has a high impedance state based on the first state, the second state, and the third state.

7. The article of claim 5 further causing a machine to store the third state only if at least two sources drive the node.

8. The article of claim 5 further causing a machine to:
    determine the output based on which of the first state, the second state, and the third state is at a logic high.

9. An apparatus for simulating a logic design, the apparatus comprising:
    a memory that stores executable instructions; and
    a processor that executes the instructions to:
        store a first state to identify in a simulation of a logic design whether a first node included in the logic design has a logic high value,
        store a second state to identify in simulation of the logic design whether the first node has a logic low value,
        store a third state to identify in simulation of the logic design whether the first node has an undefined state, and
        perform a three state simulation of the logic design to determine an output of the node in simulation of the logic design based on the first state, the second state, and the third state; and
        determine if the three state simulation of the logic design was successful, based on whether the output of the node has an undefined state, the three state simulation being successful if the output of the node is a defined state; and
        perform a four state simulation of the logic design if the three state simulation of the logic design was successful.

10. The apparatus of claim 9 further executing the instructions to determine whether the output of the node in simulation of the logic design has a high impedance state based on the first state, the second state, and the third state.

11. The apparatus of claim 9 further executing the instructions to store the third state only if at least two sources drive the node.

12. The apparatus of claim 9 further executing the instructions to perform four state simulation of the logic design subsequent to the simulation of the logic design if the simulation of the logic design was successful.

13. The apparatus of claim 9 further executing the instructions to determine the output based on which of the first state, the second state, and the third state is at a logic high.

* * * * *